US006157724A

United States Patent [19]

Kawakami

[11] Patent Number: 6,157,724

[45] Date of Patent: Dec. 5, 2000

[54] APPARATUS HAVING LOUDSPEAKERS CONCURRENTLY PRODUCING MUSIC SOUND AND REFLECTION SOUND

[75] Inventor: Fukushi Kawakami, Hamamatsu, Japan

[73] Assignee: Yamaha Corporation, Hamamatsu, Japan

[21] Appl. No.: 09/033,971

[22] Filed: Mar. 3, 1998

[30] Foreign Application Priority Data

Mar. 3, 1997 [JP] Japan .................................... 9-063866

[51] Int. Cl.[7] .............................. G10H 7/00; G10H 5/00; H03G 3/00

[52] U.S. Cl. ................................ 381/63; 381/61; 84/630; 84/626; 84/707; 84/DIG. 26

[58] Field of Search ................................ 381/61, 63, 77, 381/80, 82, 83, 85, 66, 93; 84/626, 630

[56] References Cited

U.S. PATENT DOCUMENTS

| | | | |
|---|---|---|---|
| 2,199,702 | 5/1940 | Hammond . | |
| 4,058,045 | 11/1977 | Jennings et al. . | |
| 5,119,428 | 6/1992 | Prinssen | 381/83 |
| 5,233,661 | 8/1993 | Kawamura | 381/61 |
| 5,513,265 | 4/1996 | Hirano | 381/66 |
| 5,642,425 | 6/1997 | Kawakami . | |
| 5,684,262 | 11/1997 | Nakamura | 811/654 |

FOREIGN PATENT DOCUMENTS

| | | |
|---|---|---|
| 3424754 | 1/1986 | Germany . |
| 60-138396 | 6/1985 | Japan . |
| 4356356 | 12/1992 | Japan . |
| 5318513 | 12/1993 | Japan . |

*Primary Examiner*—Forester W. Isen
*Assistant Examiner*—Brian Tyrone Pendleton
*Attorney, Agent, or Firm*—Pillsbury Madison & Sutro LLP

[57] ABSTRACT

A music apparatus is constructed for introducing a music sound into an acoustic space, and is equipped with an acoustic feedback system for introducing a reflection sound into the acoustic space. In the music apparatus, an input device sequentially provides performance information. A sound source generates a music signal representative of the music sound in response to the performance information provided from the input device. A plurality of channels of the acoustic feedback system are provided in the music apparatus, and are spatially separate from each other. Each channel is structured by a microphone for collecting a sound from the acoustic space to produce a sound signal representative of the sound introduced into the acoustic space, a processor for processing the sound signal to generate a reflection signal representative of a reflection sound in the acoustic space, a mixer for mixing the reflection signal and the music signal with each other to form a mix signal, and a loudspeaker for acoustically reproducing the mix signal to introduce the music sound and the reflection sound into the acoustic space.

41 Claims, 6 Drawing Sheets

APPARATUS HAVING LOUDSPEAKERS CONCURRENTLY PRODUCING MUSIC SOUND AND REFLECTION SOUND

BACKGROUND OF THE INVENTION

The present invention relates to a sound field controller for intensifying impression of a sound field such as reverberation and spatial impressions and for realizing natural sounds with simple constitution.

In conventional electronic musical instruments, a waveform of music sound is generated by a tone generating circuit or a tone generator. An effect for example, echo, reverberation, or tremolo is appropriately imparted to the generated music sound. The resultant music sound is amplified by a power amplifier, and the amplified music sound is emitted to a surrounding space through a single loudspeaker or a plurality of loudspeakers.

In the conventional electronic musical instrument, the effects except for tremolo caused by loudspeaker rotation are normally imparted by electrical signal processing, which could not create natural sound field effects such as echo and reverberation. In addition, sound effects are separately imparted for different musical instruments. In ensemble, the quality, volume, length and so on of acoustics such as reverberation differ from one instrument to another, thereby sometimes losing integrity of performance or causing a sense of incongruity.

Aside from above, an acoustic feedback system is known as a sound field support apparatus for intensifying the reverberation and spatial impressions in a listening room. In this conventional system, a loudspeaker and a microphone are separately arranged in a room by an appropriate distance. A sound picked up by the microphone is supplied to a FIR (Finite Impulse Response: non-cyclic) filter through a head amplifier to generate a reverberation signal (mainly an initial reflection signal). The generated reverberation signal is reproduced from the loudspeaker through a power amplifier. The reproduced sound is picked up by the microphone. This loop is repeated to increase the impression of volume (or increase sound pressure), to increase the impression of reverberation (or extend reverberation time). and to increase the impression of space (or intensify a side reflection tone energy).

However, imparting of reverberation by the sound field support system requires the dedicated loudspeakers. This system also requires one to install the microphones and the loudspeakers on the walls and ceiling of the room, to arrange a main frame of the apparatus independently or separately from the microphones and the loudspeakers, and to wire signal cables on the walls and ceiling of the room, thereby making the scale of the system large and therefore making the installation of the system difficult.

SUMMARY OF THE INVENTION

It is therefore an object of the present invention to provide, by overcoming the above-mentioned problems involved in the conventional technology, a sound field controller that implements natural acoustic sound field effects by simplified constitution.

The present invention combines an acoustic feedback 'system with an electronic musical instrument. Namely, in carrying out the invention and according to one aspect thereof, there is provided a sound field controller comprising a performance input section, a tone generator for generating a musical tone signal according to performance information inputted from the performance input section or externally inputted performance information, a plurality of microphones arranged at different positions to pick up a sound coming from surroundings, a reflection tone signal generator or processor for generating a reflection tone signal for a tone signal picked up by the plurality of microphones, mixing means for mixing the reflection tone signal generated by the reflection tone signal generator with the musical tone signal generated by the tone generator, and a plurality of loudspeakers arranged at different positions in the surroundings to reproduce a mix signal outputted from the mixing means.

According to the above-mentioned novel constitution, the same acoustics or sound effects are imparted to both of a musical tone generated by this electronic musical instrument and a tone picked up from the outside by each of the microphones. Therefore, in ensemble play between this electronic musical instrument and another electronic musical instrument or an acoustic musical instrument, the same acoustics are imparted to all musical instruments, resulting in creation of natural sound field effect. Besides, the loudspeakers used for reproducing musical tones of the electronic musical instrument also serve as loudspeakers for the acoustic feedback system, thereby reducing the number of loudspeakers to simplify the system constitution. For example, incorporating the components of the above-mentioned novel constitution into the electronic musical instrument facilitates installation and transportation of the system.

It should be noted that sequential switching between combinations of the plurality of microphones and the plurality of loudspeakers can level transfer characteristics between the microphones and the loudspeakers, thereby reducing coloration and increasing howling margin. This can suppress coloration and howling even if the loudspeaker-to-microphone distance is fixed.

The reflection tone signal generator is constituted by the FIR filter. In such a case, reflection tone parameters of this FIR filter may be varied continuously and randomly along time axis. This novel constitution flattens the frequency characteristics of the FIR filter, thereby suppressing coloration and howling.

DETAILED DESCRIPTION OF THE INVENTION

Figure 2:
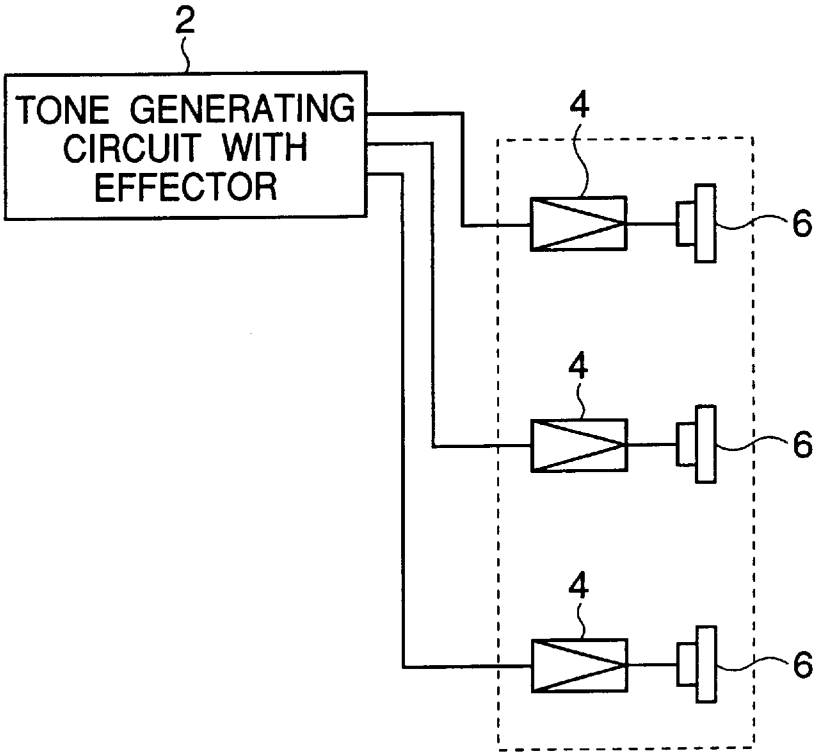
FIG. 2 is a block diagram illustrating a musical tone generating system of a typical electronic musical instrument.

In order to facilitate understanding of the invention, FIG. 2 shows a typical electronic musical instrument. In this typical electronic musical instrument, a waveform of music sound is generated by a tone generating circuit (a tone generator) 2. An effect (for example, echo, reverberation or tremolo) is appropriately imparted to the generated waveform. The resultant musical tone signal is amplified by a power amplifier 4. The amplified musical tone signal is radiated into the surrounding space through a plurality of loudspeakers 6. In the electronic musical instrument shown in FIG. 2, the effects (except for tremolo caused by loudspeaker rotation for example) are imparted by electrical signal processing, which would restrict naturality of the sound field effects such as echo and reverberation. In addition, the sound effects are separately imparted for different electronic musical instruments. In ensemble play, the quality, volume, length, and so on of acoustics (especially, reverberation) differ from one instrument to another, thereby sometimes losing integrity of performance or causing a sense of incongruity.

Figure 3:
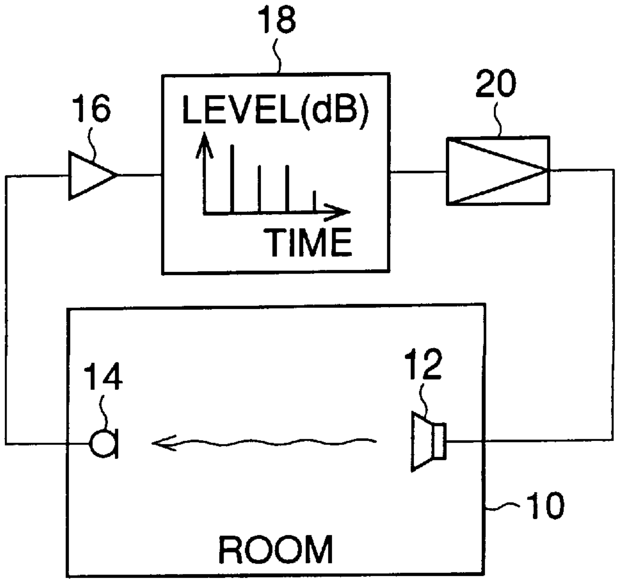
FIG. 3 is a diagram illustrating principles of operation of an acoustic feedback system.

FIG. 3 shows a typical acoustic feedback system known as a sound field support apparatus for intensifying the reverberation and spatial impressions of a listening room. In this typical system, a loudspeaker 12 and a microphone 14 are spaced apart from each other in a room 10 by an appropriate distance. A sound picked up by the microphone 14 is supplied to a FIR (Finite Impulse Response: noncyclic) filter 18 through a head amplifier 16 to generate a reverberation signal (mainly an initial reflection signal). The generated reverberation signal is reproduced from the loudspeaker 12 through a power amplifier 20. The reproduced sound is picked up by the microphone 14. This loop is repeated to increase the impression of volume (or increase sound pressure), to increase the impression of reverberation (or extend reverberation time), and to increase the impression of space (or intensify a side reflection tone energy).

Figure 4:
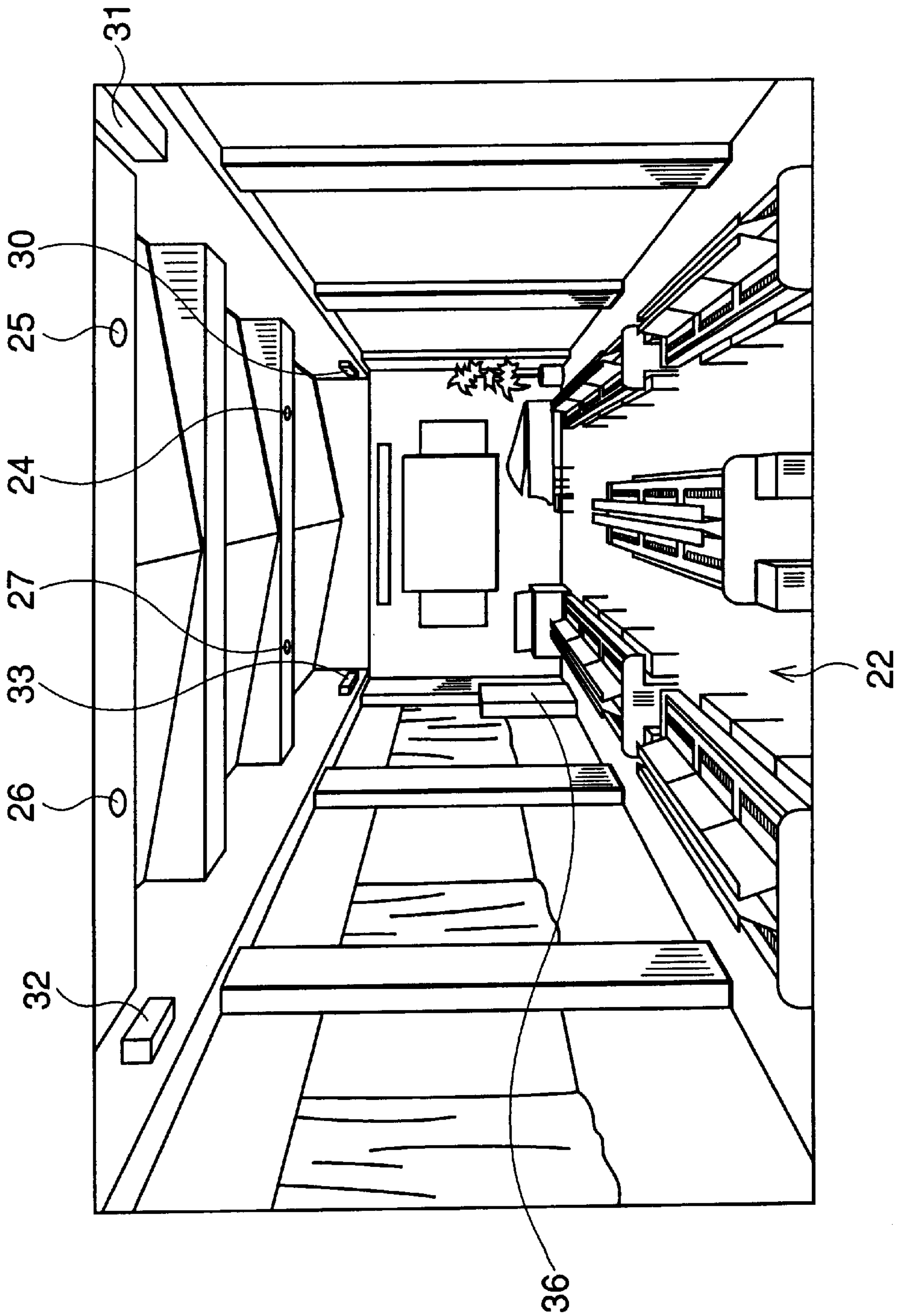
FIG. 4 is a diagram illustrating an arrangement indicative of an example of typical installation of the acoustic feedback system.
Figure 5:
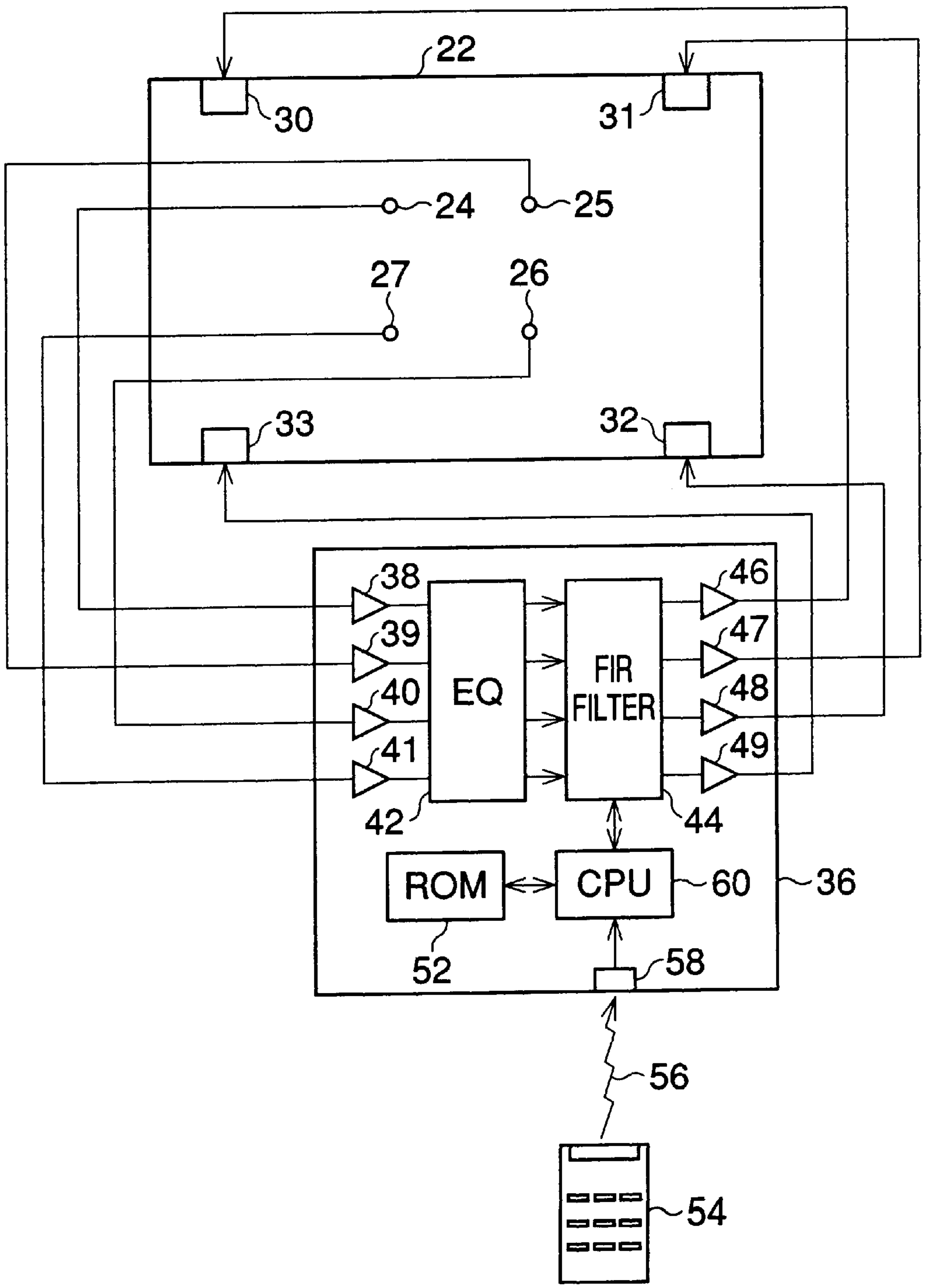
FIG. 5 is a block diagram illustrating a circuit constitution of the acoustic feedback system shown in FIG. 4.

A practical sound field controller based on the above-mentioned acoustic feedback system is illustrated in FIGS. 4 and 5. FIG. 4 shows an example of arrangement of microphones and loudspeakers. In a listening room 22 such as a music room, four microphones 24 through 27 are installed on the ceiling, and four loudspeakers 30 through 33 are installed on the walls. A controller main 36 for controlling this system in its entirety is constituted as a separate apparatus and arranged inside the room 22.

FIG. 5 is a block diagram illustrating a circuit constitution of this system. A tone signal picked up from each of the microphones 24 through 27 is adjusted in frequency characteristics by an equalizer 42 connected to each of head amplifiers 38 through 41 to prevent howling from occurring. The adjusted signal is supplied to an FIR filter 44 to provide an initial reflection tone. The initial reflection sound or tone is amplified by each of amplifiers 46 through 49. The amplified tone is reproduced by each of the loudspeakers 30 through 33. A ROM 52 stores initial reflection tone parameters of various sound field patterns. When one of the sound field patterns is selected by an external infrared remote commander 54, a corresponding field sound pattern select signal 56 is transmitted to be received by the apparatus main 36 at a light receiving window 58. Receiving this signal, a CPU 60 reads the initial reflection tone parameter of the corresponding sound field pattern from the ROM 52, and sets this parameter to the FIR filter 44 to set an acoustic space.

Imparting of reverberation by the sound field support system shown in FIGS. 4 and 5 requires the dedicated loudspeakers 30 through 33. This system also requires one to install the microphones 24 through 27 and the loudspeakers 30 through 33 on the walls and ceiling of the room 22, to arrange the apparatus main 36 independently, and to wire the signal cables on the walls and ceiling of the room 22, thereby making the scale of the system large and therefore making the installation of the system difficult.

Figure 6:
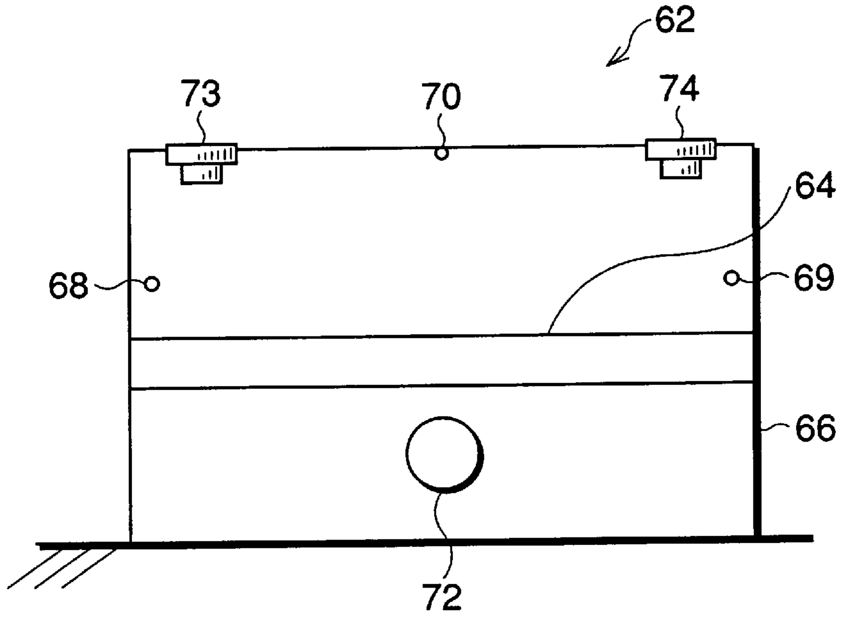
FIGS. 6(*a*) and 6(*b*) are an elevational view and a side view illustrating an example of an arrangement of microphones and loudspeakers when the present invention is applied to the electronic piano.
Figure 6:
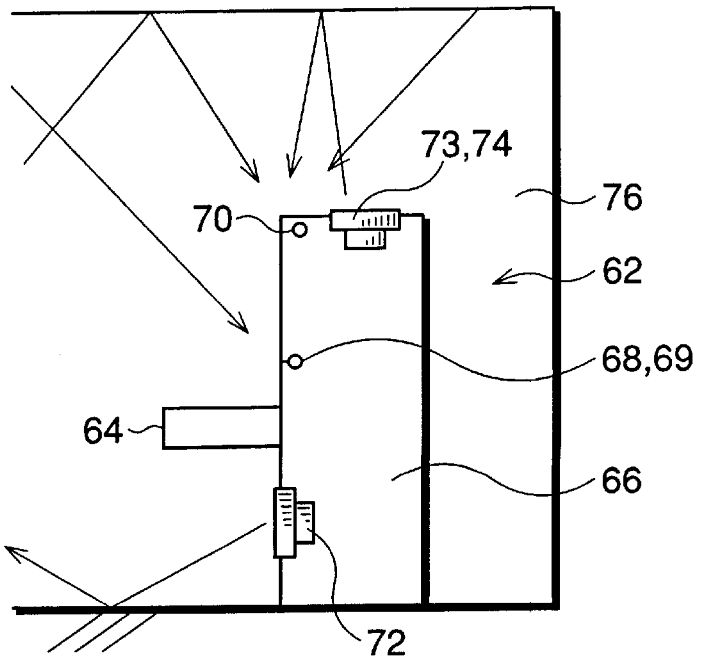

The following describes a sound field controller associated with the present invention embodied as an electronic piano. FIGS. 6(*a*) and 6(*b*) show an example of an arrangement of microphones and loudspeakers in the electronic piano, in which FIG. 6(*a*) is an elevational view and FIG. 6(*b*) is a side view. The electronic piano 62 has a keyboard (a performance operating section) 64 in a front middle portion of the piano. Three microphones 68 through 70 are set in a cabinet or frame 66 of the electronic piano 62 with sound receiving sections of these microphones made open to the outside. Of these three microphones, the microphones 68 and 69 are spaced from each other on the front left and right sides of the cabinet 66 above the keyboard 64. The microphone 70 is arranged at the middle in the horizontal direction of the top plate of the cabinet 66.

Three loudspeakers 72 through 74 are set in the cabinet 66 with radiation surfaces of the loudspeakers exposed outside. Of these three loudspeakers, the loudspeaker 72 is arranged at the middle in the horizontal direction below the keyboard 64 on the front of the cabinet 66. The loudspeakers 73 and 74 are spaced from each other on the left and right sides of the top plate of the cabinet 66. The signal cables of the microphones 68 through 70 and the loudspeakers 72 through 74 are arranged inside the cabinet 66.

A musical sound created by the keyboard 64 is reproduced from the loudspeakers 72 through 74. The reproduced musical sound and a sound coming from another musical instrument if any are reflected from the walls and ceiling of a room 76, and picked up by the microphones 68 through 70 as shown in FIG. 6(*b*).

Figure 1:
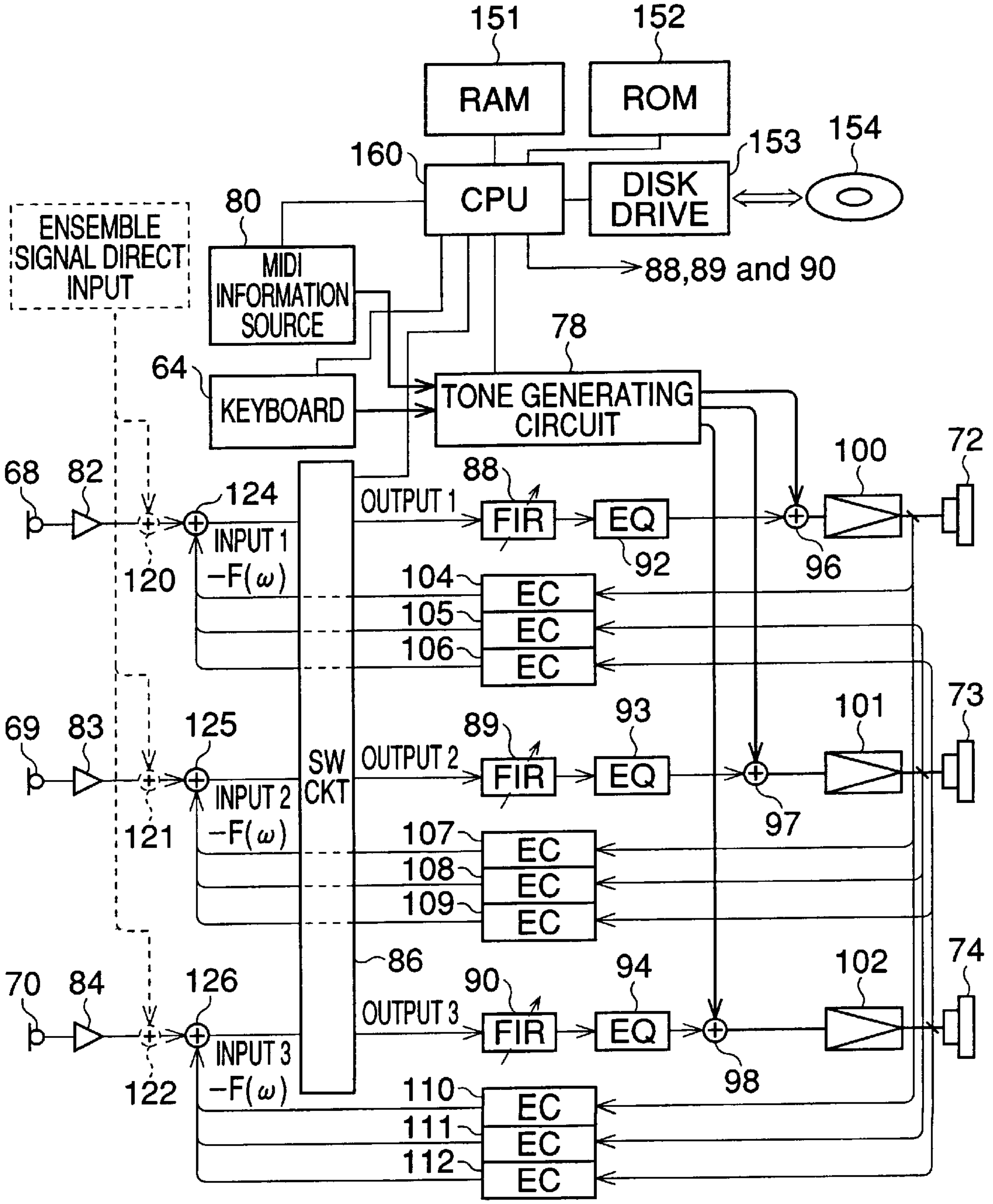
FIG. 1 is a block diagram illustrating an embodiment of the present invention, particularly illustrating a circuit section arranged in a cabinet of an electronic piano.

FIG. 1 is a block diagram illustrating the constitution of the circuitry arranged inside the cabinet 66 of the electronic piano 62. The signal lines indicated by thick lines belong to regular or ordinary circuit portions of the electronic piano. In this circuitry, three independent signal paths running from the three microphones 68 through 70 to the loudspeakers 72 through 74 are formed in parallel to each other to constitute three channels. A sound source of the electronic piano includes a tone generating circuit 78, a waveform shaping circuit, and an effect processing circuit. The tone generating circuit 78 generates a musical tone signal according to performance information inputted from the performance operating section (the keyboard) 64 or according to performance information outputted from a MIDI information source 80 (for example, a magnetic disk device or a optical disk device for reproducing performance information for automatic play). The generated musical tone signal is imparted with a sound effect such as echo as required, and the resultant musical tone signal is outputted. This apparatus further includes a CPU 160 for controlling various parts and sections of the apparatus, a RAM 151 used as a working area of the CPU 160, a ROM 152 storing program instructions executed by the CPU 160, and a disk drive 153 for receiving a machine readable medium 154 such as a floppy disk storing program instructions executable by the CPU 160.

The inventive music apparatus of FIG. 1 is constructed for introducing a music sound into an acoustic space exemplified by the music room 76 or else, and is equipped with an acoustic feedback system for introducing a reflection sound into the acoustic space. In the music apparatus, an input device in the form of the keyboard 64 or the MIDI information source 80 sequentially provides performance information. A sound source including the tone generating circuit 78 generates a music signal representative of the music sound in response to the performance information provided from the input device. A plurality of channels of the acoustic feedback system are provided in the music apparatus, and are spatially separate from each other. There are three channels in this embodiment. All the channels have a similar structure. For example, the first channel is structured by the microphone 68 for collecting a sound from the acoustic space to produce a sound signal representative of the sound introduced into the acoustic space, a processor for processing the sound signal to generate a reflection signal representative of a reflection sound in the acoustic space, a mixer 96 for mixing the reflection signal and the music signal with each other to form a mix signal, and the loudspeaker 72 for acoustically reproducing the mix signal to introduce the music sound and the reflection sound into the acoustic space. Specifically, the processor comprises a Finite Impulse Response filter 88 for filtering the sound signal according to parameters to generate the reflection signal. The parameters continuously and randomly vary so as to average the reflection signals among the plurality of the channels.

The inventive music apparatus is further provided with a switch device in the form of a switching circuit 86 for dynamically switching the plurality of the channels between a plurality of microphones 68,69 and 70, and a plurality of loudspeakers 72, 73 and 74 such that the microphones 68,69 and 70 are cyclically and interchangeably connected to the loudspeakers 72, 73 and 74. The inventive music apparatus further comprises echo cancelers (EC) 104–112 disposed between the plurality of microphones 68,69 and 70 and the plurality of loudspeakers 72, 73 and 74 for canceling direct feedback of sounds from the loudspeakers 72, 73 and 74 to the microphones 68,69 and 70.

Figure 7:
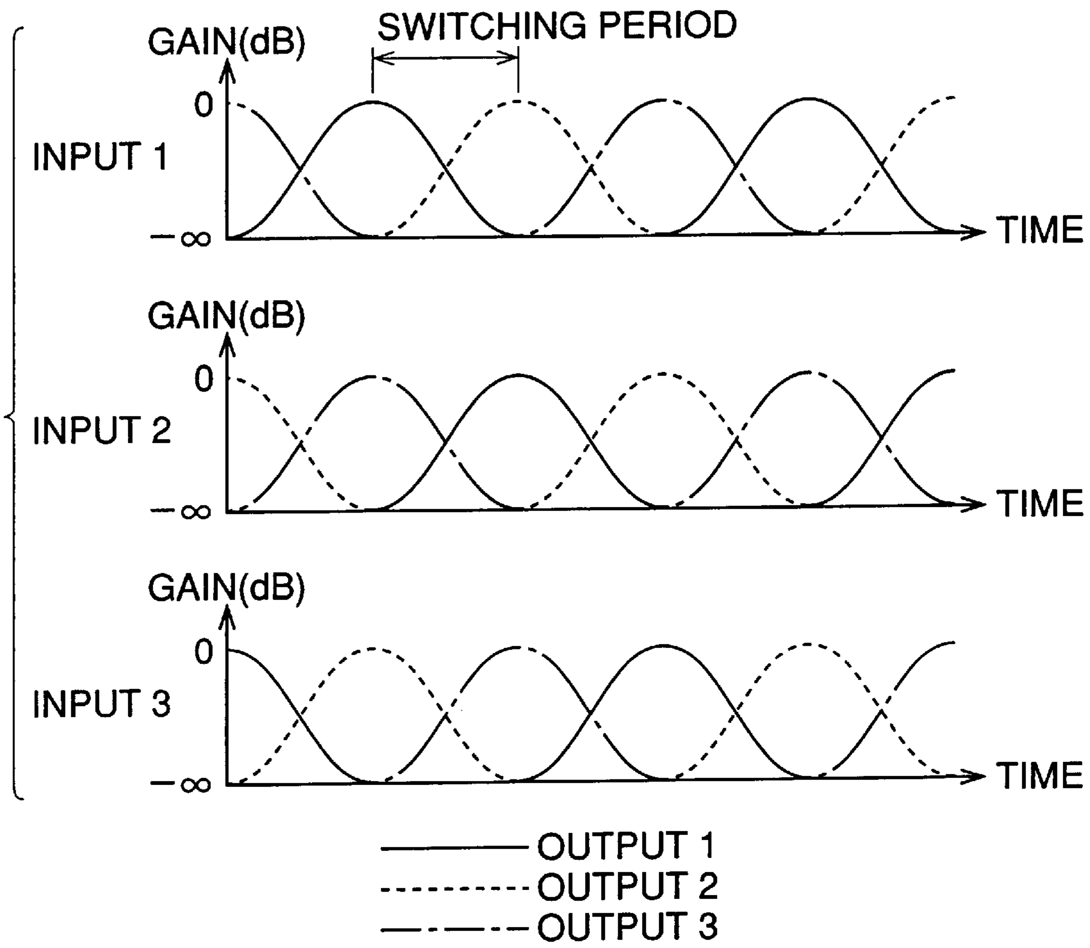
FIG. 7 is a diagram illustrating operations of a tone signal switching circuit shown in FIG. 1.

In detail, the sound signal picked up by the microphones 68 through 70 is amplified by head amplifiers 82 through 84, and is inputted in the signal switching circuit 86. The switching circuit 86 sequentially switches between combinations of three inputs 1 through 3 and three outputs 1 through 3. An example of input/output switching by the signal switching circuit 86 is shown in FIG. 7. The signal switching circuit 86 constitutes a type of a level matrix, in which three lines of inputs 1 through 3 are alternately and equally distributed to the three outputs 1 through 3 in a certain period. For a sum of gains of the three lines to be maintained constant at each point of time, the gain continuously varies according to, for example, a sine curve, a sawtooth wave, or mutually independent random signals satisfying the above-mentioned condition. This constitution provides an effect similar to that obtained by sequentially and repetitively alternating the installation positions of the three microphones 68 through 70, thereby leveling the transfer characteristics by spatial averaging to result in reduced coloration and enlarged howling margin. It should be noted that the switching period is set to, for example, 1 to ½ of the reverberation time of the room used.

Figure 8:
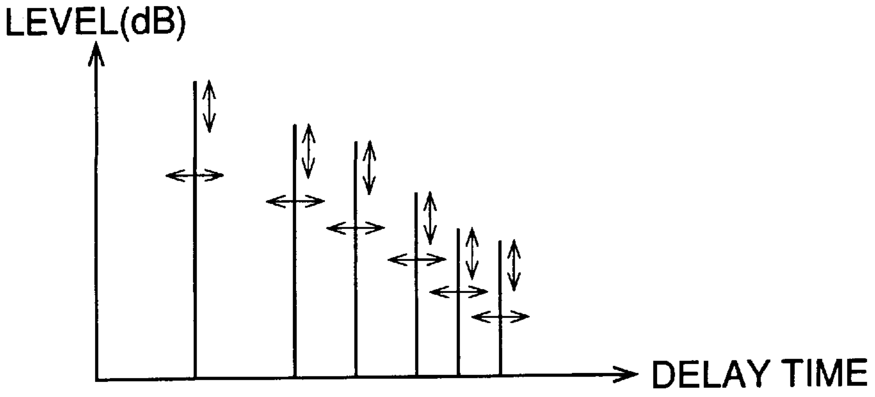
FIG. 8 is a diagram illustrating reflection tone parameters of FIR filters shown in FIG. 1 and time-dependent variations of a time axis and a level axis of the parameters.

The three lines of the outputs 1 through 3 of the signal switching circuit 86 are inputted in the FIR filters 88 through 90 to generate the reflection sound signals. The reflection sound parameters set to the FIR filters 88 through 90 are different from each other. In addition, these parameters are continuously and randomly varied separately along time axis as required as shown in FIG. 8. This variation reduces fluctuation in the frequency characteristics caused by the FIR filters 88 through 90 if these filters are of fixed type, thereby leveling the frequency characteristics, resulting in further reduction in coloration and further enlargement in howling margin. It should be noted that the parameter variation along time axis is realized by moving output taps of the FIR filters 88 through 90 in a non-correlated manner in a range of, for example, variation width of 0.25 msec to 5 msec, causing no auditory unnaturalness. Also, as shown in FIG. 5, reflection tone parameters of various types may be stored in the ROM 152, from which a performer selects desired reflection tone parameters to set the selected parameters to the FIR filters 88 through 90.

The reflection sound signals generated by the FIR filters 88 through 90 are inputted in equalizers 92 through 94, in which undulation unique to frequency characteristics of the room and dependent on the installation positions of the loudspeakers 72 through 74 and the electronic piano 62 is roughly flattened. The characteristics of the equalizers 92 through 94 are automatically or manually adjusted for each frequency band so that the peak of the loop gain of each channel becomes −12 dB relative to the howling point.

The reflection sound signals outputted from the equalizers 92 through 94 are added by the mixers 96 through 98 to the musical sound signal outputted from the tone generating circuit 78. The resultant mix signals are amplified by power amplifiers 100 through 102, and the amplified signals are reproduced by the loudspeakers 72 through 74. The sounds reproduced by the loudspeakers 72 through 74 are reflected from the walls and ceiling of the room 76. The reflected sounds are commonly picked up by the microphones 68 through 70, and the collected sounds are processed by the three channels to be reproduced from the loudspeakers 72 through 74 again. This loop occurs repetitively on each channel so as to impart longer reverberation fused with the acoustics inherent to the room 76.

Echo cancelers 104 through 112 correct a sawtooth filter effect due to a direct feedback loop formed between the loudspeakers 72 through 74 and the microphones 68 through 70. To be more specific, unlike the conventional acoustic feedback system, if a microphone and a loudspeaker are arranged for a single musical instrument according to the invention, the number of paths for feeding back the sounds radiated from the loudspeaker increases, because the physical distance between a sound source point and a sound receiving point is small, thereby causing fluctuation in the frequency characteristics of the loop gain. Therefore, in order to cancel the sawtooth filter effect due to a response F(ω) between the sound source point and the sound receiving point, the echo cancelers 104 through 112 that are $n^2$ (n=the number of channels; in the example of FIG. 1, n=3) are prepared. These echo cancelers 104 through 112 feed the output signals of the three channels back to adders 124 through 126 arranged before the signal switching circuit 86 to cancel the sounds directly fed back from the loudspeakers 72 through 74 to the microphones 68 through 70. This constitution prevents howling more effectively.

The characteristics of the echo cancelers 104 through 112 are adjusted to a response near −F(ω) to cancel the direct feedback loop between the loudspeakers 72 through 74 and the microphones 68 through 70 and to cancel a feedback loop corresponding to a primary reflection sound (especially when the electronic piano is located by a window of the room), namely the initial portion of an impulse response by acoustic feedback. It should be noted that the echo cancelers 104 through 112 may be constituted by adaptive filters to adjust the frequency characteristics automatically. The echo cancelers 104 through 112 may be adjusted after installing of the electronic piano 62 in the room 76. In detail, the echo cancelers 104 through 112 may be adjusted by generating an impulse noise by the tone generating circuit 78, then reproducing the generated impulse noise from the loudspeakers 72 through 74, picking up the reproduced impulse noise by the microphones 68 through 70, measuring an impulse response of the picked up impulse noise, and manually or automatically adjusting the parameters of the echo cancelers 104 through 112 to generally −F(ω) such that the initial portion of the impulse response is canceled.

The equalizers 92 through 94 and the echo cancelers 104 through 112 may be adjusted by a first step of automatically or manually adjusting the equalizers 92 through 94 at the initial stage of adjustment process, for example, and then a second step of automatically or manually adjusting the echo cancelers 104 through 112. Further, the equalizers 92 through 94 may be automatically or manually adjusted finely (readjustment) while or after automatically or manually adjusting the echo cancelers 104 through 112.

According to the electronic piano having the above-mentioned constitution, the plurality of mutually independent signal paths are constituted from the microphones 68 through 70 to the loudspeakers 72 through 74, and the leveling effect (the addition in squared sound pressure area) that cannot be obtained by simple sound pressure addition (so-called mixing) is obtained according to the invention. Besides, the transfer characteristic between the microphones 68 through 70 and the loudspeakers 72 through 74 is leveled more significantly by the switching of the signal paths by the signal switching circuit 86 and the time-dependent processing of the reflection parameters in the FIR filters 88 through 90, and the echo cancelers 104 through 112, thereby significantly reducing coloration and enlarging howling margin.

As described, the same acoustics are imparted to both of the musical sound generated by the electronic piano 62 itself and the external sound picked up from the outside by the microphones 68 through 70. In ensemble or joint play by the electronic piano 62 and another electronic musical instrument or an acoustic musical instrument, the same acoustics are imparted to the music sounds of all instruments, thereby providing the natural sound field effect. Moreover, because the musical sound reproducing loudspeakers 72 through 74 of the electronic piano 62 also serve as the loudspeakers for the acoustic feedback system, the number of loudspeakers as a whole can be reduced, resulting in the simplified constitution. Further, because the above-mentioned components are integrally assembled in the cabinet 66 of the electronic piano 62, installation and transportation of the sound field controller are significantly facilitated.

It will be apparent that an ensemble signal provided from another musical instrument may be inputted directly into the three channels by the adders 120 through 122 as indicated by dashed lines shown in FIG. 1. In the above-mentioned embodiment, three channels are provided. It will be apparent that more than three channels may be provided. In the above-mentioned embodiment, the present invention is applied to the electronic piano. It will be apparent that the present invention is also applicable to an electronic keyboard instrument of another type and a non-keyboard electronic musical instrument.

Lastly, referring back to FIG. 1, the inventive apparatus 1 is constructed for controlling a sound field. In the apparatus, input means is composed of the keyboard 64 or the MIDI information source 80 for sequentially providing performance information. Generator means is composed of the tone generating circuit 78 for generating a music signal representative of a music sound in response to the performance information provided from the input means. The plurality of microphones 68, 69 and 70 are arranged separately from each other. Each microphone collects a sound introduced into the sound field to produce a sound signal representative of the sound introduced into the sound field. Processor means is provided in the form of the FIR filters 88, 89 and 90 for processing each sound signal produced by each microphone to generate each reflection signal representative of a reflection sound in the sound field. Mixer means is composed of the mixers 96, 97 and 98 for mixing each reflection signal and the music signal with each other to form each mix signal. The plurality of loudspeakers 72, 73 and 74 are arranged separately from each other. Each loudspeaker acoustically reproduces each mix signal to introduce the music sound and the reflection sound into the sound field. Preferably, the processor means comprises the Finite Impulse Response filter 88, 89 or 90 that filters the sound signal according to parameters to generate the reflection signal. The parameters continuously and randomly vary so as to average the reflection signals among the plurality of the microphones 68, 69 and 70.

The inventive apparatus further comprises switch means in the form of the switching circuit 86 for switching paths of signals between the plurality of the microphones 68, 69 and 70, and the plurality of the loudspeakers 72, 73 and 74 such that the microphones are cyclically and interchangeably connected to the loudspeakers. The inventive apparatus further comprises canceler means in the form of the echo cancelers 104–112 disposed between the microphones 68, 69 and 70 and the loudspeakers 72, 73 and 74 for canceling direct feedback of sounds from the loudspeakers to the microphones. The inventive apparatus further comprises the frame 66 for accommodating therein the input means, the generator means, the microphones and the loudspeakers to constitute an electronic musical instrument in the form of the electronic piano 62 for introducing the music sound into the sound field or room 76. The electronic musical instrument is installed with an acoustic feedback system composed of the microphones and the processor means in combination with the loudspeakers to introduce the reflection sound into the sound field. The microphones collect another music sound introduced into the sound field by another musical instrument in addition to the music sound produced by the electronic musical instrument so as to enhance an ensemble of the electronic musical instrument and said another musical instrument. The input means may comprise a music play implement of the electronic musical instrument manipulated to provide the performance information.

The machine readable medium 154 is used in the music apparatus having the CPU 160 for introducing a music sound and a reflection sound into a sound field by means of the plurality of microphones 68, 69 and 70 arranged separately from each other and the plurality of loudspeakers 72, 73 and 74 arranged separately from each other. The medium 154 contains program instructions executable by the CPU 160 for causing the music apparatus to perform the steps of sequentially providing performance information, generating a music signal representative of the music sound in response to the performance information, operating each microphone to collect a sound from the sound field to produce a sound signal representative of the sound introduced into the sound field, processing each sound signal produced by each microphone to generate each reflection signal representative of a reflection sound in the sound field, mixing each reflection signal and the music signal with each other to form each mix signal, and operating each loudspeaker to acoustically reproduce each mix signal to introduce the music sound and the reflection sound into the sound field.

The steps performed by the music apparatus further comprise switching paths of signals between the plurality of the microphones and the plurality of the loudspeakers such that the microphones are cyclically and interchangeably connected to the loudspeakers. The steps performed by the music apparatus further comprise canceling direct feedback of sounds from the loudspeakers to the microphones.

What is claimed is:

1. An apparatus for controlling a sound field, comprising:

input means for sequentially providing performance information;

generator means for generating a music signal representative of a music sound in response to the performance information provided from the input means;

a plurality of microphones arranged separately from each other, each microphone collecting a sound introduced into the sound field to produce a sound signal representative of the sound introduced into the sound field;

processor means for processing each sound signal produced by each microphone to generate a reflection signal representative of a reflection sound in the sound field;

mixer means for mixing each reflection signal and the music signal with each other to form a mix signal; and a plurality of loudspeakers arranged separately from each other, each loudspeaker acoustically reproducing each mix signal to introduce the music sound and the reflection sound into the sound field.

2. An apparatus according to claim 1, further comprising switch means for switching paths of signals between the plurality of the microphones and the plurality of the loudspeakers such that the microphones are cyclically and interchangeably connected to the loudspeakers.

3. An apparatus according to claim 1, wherein the processor means comprises a Finite Impulse Response filter that filters the sound signal according to parameters to generate the reflection signal, the parameters continuously and randomly varying so as to average the reflection signals among the plurality of the microphones.

4. An apparatus according to claim 1, further comprising canceler means disposed between the microphones and the loudspeakers for canceling direct feedback of sounds from the loudspeakers to the microphones.

5. An apparatus according to claim 1, further comprising a frame for accommodating therein the input means, the generator means and the loudspeakers to constitute an electronic musical instrument for introducing the music sound into the sound field, wherein the electronic musical instrument is installed with an acoustic feedback system composed of the microphones and the processor means in combination with the loudspeakers to introduce the reflection sound into the sound field.

6. An apparatus for controlling a sound field, comprising:

input means for sequentially providing performance information;

generator means for generating a music signal representative of a music sound in response to the performance information provided from the input means;

a plurality of microphones arranged separately from each other, each microphone collecting a sound introduced into the sound field to produce a sound signal representative of the sound introduced into the sound field;

processor means for processing each sound signal produced by each microphone to generate a reflection signal representative of a reflection sound in the sound field;

mixer means for mixing each reflection signal and the music signal with each other to form a mix signal;

a plurality of loudspeakers arranged separately from each other, each loudspeaker acoustically reproducing each mix signal to introduce the music sound and the reflection sound into the sound field; and a frame for accommodating therein the input means, the generator means and the loudspeakers to constitute an electronic musical instrument for introducing the music sound into the sound field, wherein the electronic musical instrument is installed with an acoustic feedback system composed of the microphones and the processor means in combination with the loudspeakers to introduce the reflection sound into the sound field, and wherein the microphones collect another music sound introduced into the sound field by another musical instrument in addition to the music sound produced by the electronic musical instrument so as to enhance an ensemble of the electronic musical instrument and said another musical instrument.

7. An apparatus according to claim 5, wherein the input means comprises a music play implement of the electronic musical instrument manipulated to provide the performance information.

8. A music apparatus for introducing a music sound into an acoustic space and being equipped with an acoustic feedback system for introducing a reflection sound into the acoustic space, the music apparatus comprising:

an input device that sequentially provides performance information;

a sound source that generates a music signal representative of the music sound in response to the performance information provided from the input device; and a plurality of channels of the acoustic feedback system which are spatially separate from each other;

wherein each channel comprises a microphone for collecting a sound from the acoustic space to produce a sound signal representative of the sound introduced into the acoustic space, a processor for processing the sound signal to generate a reflection signal representative of a reflection sound in the acoustic space, a mixer for mixing the reflection signal and the music signal with each other to form a mix signal, and a loudspeaker for acoustically reproducing the mix signal to introduce the music sound and the reflection sound into the acoustic space.

9. A music apparatus according to claim 8, further comprising a switch device for dynamically switching the plurality of the channels between a plurality of microphones and a plurality of loudspeakers such that the microphones are cyclically and interchangeably connected to the loudspeakers.

10. A music apparatus according to claim 8, wherein the processor comprises a Finite Impulse Response filter for filtering the sound signal according to parameters to generate the reflection signal, the parameters continuously and randomly varying so as to average the reflection signals among the plurality of the channels.

11. A music apparatus according to claim 8, further comprising a canceler disposed between a plurality of microphones and a plurality of loudspeakers for canceling direct feedback of sounds from the loudspeakers to the microphones.

12. A method of introducing a music sound and a reflection sound into a sound field, the method comprising the steps of:

sequentially providing performance information;

generating a music signal representative of the music sound in response to the performance information;

arranging a plurality of microphones separately from each other, each microphone collecting a sound from the sound field to produce a sound signal representative of the sound introduced into the sound field;

processing each sound signal produced by each microphone to generate each reflection signal representative of a reflection sound in the sound field;

mixing each reflection signal and the music signal with each other to form each mix signal; and arranging a plurality of loudspeakers separately from each other, each loudspeaker acoustically reproducing each mix signal to introduce the music sound and the reflection sound into the sound field.

13. A method according to claim 12, further comprising the step of switching paths of signals between the plurality of the microphones and the plurality of the loudspeakers such that the microphones are cyclically and interchangeably connected to the loudspeakers.

14. A method according to claim 12, further comprising the step of canceling direct feedback of sounds from the loudspeakers to the microphones.

15. A machine readable medium for use in a music apparatus having a CPU for introducing a music sound and a reflection sound into a sound field by means of a plurality of microphones arranged separately from each other and a plurality of loudspeakers arranged separately from each other, the medium containing program instructions executable by the CPU for causing the music apparatus to perform the steps of:

sequentially providing performance information;

generating a music signal representative of the music sound in response to the performance information;

operating each microphone to collect a sound from the sound field to produce a sound signal representative of the sound introduced into the sound field;

processing each sound signal produced by each microphone to generate each reflection signal representative of a reflection sound in the sound field;

mixing each reflection signal and the music signal with each other to form each mix signal; and operating each loudspeaker to acoustically reproduce each mix signal to introduce the music sound and the reflection sound into the sound field.

16. A machine readable medium according to claim 15, wherein the steps further comprise switching paths of signals between the plurality of the microphones and the plurality of the loudspeakers such that the microphones are cyclically and interchangeably connected to the loudspeakers.

17. A machine readable medium according to claim 15, wherein the steps further comprise canceling direct feedback of sounds from the loudspeakers to the microphones.

18. An apparatus for controlling a sound field, comprising:

an input device that sequentially provides performance information;

a generator that generates a music signal representative of a music sound in response to the performance information provided from the input device;

a plurality of microphones arranged separately from each other, each microphone collecting a sound introduced into the sound field to produce a sound signal representative of the sound introduced into the sound field;

a processor that processes each sound signal produced by each microphone to generate a reflection signal representative of a reflection sound in the sound field;

a mixer that mixes each reflection signal and the music signal with each other to form a mix signal; and a plurality of loudspeakers arranged separately from each other, each loudspeaker acoustically reproducing each mix signal to introduce the music sound and the reflection sound into the sound field.

19. An apparatus for controlling a sound field, comprising:

an input device that sequentially provides performance information;

a generator that is coupled to the input device to constitute an electronic musical instrument for generating a music signal representative of a music sound in response to the performance information;

a plurality of microphones arranged separately from each other, each microphone collecting sounds including the music sound introduced into the sound field by the electronic musical instrument so as to produce a sound signal representative of the sounds;

a processor that is coupled to the microphones to constitute an acoustic feedback system for processing each sound signal produced by each microphone so as to generate a reflection signal representative of a reflection sound in the sound field, the acoustic feedback system being integrated with the electronic musical instrument to form a combination; and a plurality of loudspeakers that are coupled to the combination of the acoustic feedback system and the electronic musical instrument for acoustically reproducing the music signal and the reflection signal so as to concurrently introduce the music sound and the reflection sound into the sound field.

20. An apparatus according to claim 19, further including a frame for accommodating therein the combination of the electronic musical instrument and the acoustic feedback system.

21. An apparatus according to claim 19, further including a switch device that switches paths of signals between the plurality of the microphones and the plurality of the loudspeakers such that the microphones are interchangeably connected to the loudspeakers.

22. An apparatus according to claim 19, wherein the processor includes a Finite Impulse Response filter that filters the sound signal according to parameters to generate the reflection signal, the parameters continuously and randomly varying so as to average the reflection signals among the plurality of the microphones.

23. An apparatus according to claim 19, further including a canceler device disposed between the microphones and the loudspeakers for canceling direct feedback of sounds from the loudspeakers to the microphones.

24. An apparatus according to claim 19, wherein the microphones collect another music sound introduced into the sound field by another musical instrument in addition to the music sound produced by the electronic musical instrument so as to enhance an ensemble of the electronic musical instrument and said another musical instrument.

25. An apparatus according to claim 19, wherein the input device includes a music play implement of the electronic musical instrument manipulated to provide the performance information.

26. An apparatus according to claim 19, further including $n^2$ number of cancelers disposed between n number of the microphones and the loudspeakers for canceling direct feedback sounds from the loudspeakers to the microphones.

27. An apparatus according to claim 19, further including an adder that directly adds another music signal caused by another musical instrument into the acoustic feedback system so as to enhance an ensemble of the electronic musical instrument and said another musical instrument.

28. A music apparatus for introducing a music sound into an acoustic space and being equipped with an acoustic feedback system for introducing a reflection sound into the acoustic space, the music apparatus comprising:

an input device that sequentially provides performance information;

a sound source that is coupled to the input device to constitute an electronic musical instrument for generating a music signal representative of the music sound in response to the performance information;

a plurality of channels of the acoustic feedback system which is integrated with the electronic musical instrument to form a combination, each channel comprising a microphone for collecting a sound including the music sound introduced into the acoustic space by the electronic musical instrument so as to produce a sound signal representative of the sound, and a processor for processing the sound signal to generate a reflection signal representative of a reflection sound in the acoustic space; and a plurality of loudspeakers that are coupled to the combination of the acoustic feedback system and the electronic musical instrument for acoustically reproducing the music signal and the reflection signal so as to concurrently introduce the music sound and the reflection sound into the acoustic space.

29. A music apparatus according to claim 28, further including a switch device for dynamically switching the plurality of the channels between a plurality of microphones and a plurality of loudspeakers such that the microphones are cyclically and interchangeably connected to the loudspeakers.

30. A music apparatus according to claim 28, wherein the processor includes a Finite Impulse Response filter for filtering the sound signal according to the parameters to generate the reflection signal, the parameters continuously and randomly varying so as to average reflection signals among the plurality of the channels.

31. A music apparatus according to claim 28, further including a canceler device disposed between a plurality of microphones and the plurality of loudspeakers for canceling direct feedback of sounds from the loudspeakers to the microphones.

32. A method of concurrently introducing a music sound and reflection sounds into a sound field by a plurality of loudspeakers through an electronic musical instrument and an acoustic feedback system being integrated with the electronic musical instrument and being comprised of a plurality of microphones and processors, the method comprising the steps of:

sequentially providing performance information;

operating the electronic musical instrument to generate a music signal representative of the music sound in response to the performance information;

operating the acoustic feedback system such that each microphone collects a sound including the music sound generated by the electronic musical instrument from the sound field to produce a sound signal representative of the sound and such that the processors process each sound signal produced by each microphone to generate a reflection signal representative of a reflection sound in the sound field; and operating the plurality of loudspeakers for acoustically reproducing the music signal and the reflection signal so as to concurrently introduce the music sound and the reflection sound into the sound field.

33. A method according to claim 32, further including the step of switching paths of signals between the plurality of the microphones and the plurality of the loudspeakers such that the microphones are cyclically and interchangeably connected to the loudspeakers.

34. A method according to claim 32, further including the step of canceling direct feedback of sounds from the loudspeakers to the microphones.

35. A machine readable medium for use in an electronic musical instrument having a CPU for introducing a music sound and reflection sounds into a sound field by a plurality of loudspeakers through the electronic musical instrument and an acoustic feedback system being integrated with the electronic musical instrument and being comprised of a plurality of microphones and processors, the medium containing program instructions executable by the CPU for causing the electronic musical instrument to perform the steps of:

sequentially providing performance information;

operating the electronic musical instrument to generate a music signal representative of the music sound in response to the performance information;

operating the acoustic feedback system such that each microphone collects a sound including the music sound generated by the electronic musical instrument from the sound field to produce a sound signal representative of the sound and such that the processors process each sound signal produced by each microphone to generate a reflection signal representative of a reflection sound in the sound field; and operating the plurality of loudspeakers for acoustically reproducing the music signal and the reflection signal so as to concurrently introduce the music sound and the reflection sound into the sound field.

36. A machine readable medium according to claim 35, wherein the steps further include switching paths of signals between the plurality of the microphones and the plurality of the loudspeakers such that the microphones are interchangeably connected to the loudspeakers.

37. A machine readable medium according to claim 35, wherein the steps further include canceling direct feedback of sounds from the loudspeakers to the microphones.

38. An apparatus for controlling a sound field, comprising:

input means for sequentially providing performance information;

generator means coupled to the input means to constitute an electronic musical instrument for generating a music signal representative of a music sound in response to the performance information;

a plurality of microphones arranged separately from each other, each microphone collecting sounds including the music sound introduced into the sound field by the electronic musical instrument so as to produce a sound signal representative of the sounds;

processor means coupled to the microphones to constitute an acoustic feedback system for processing each sound signal produced by each microphone so as to generate a reflection signal representative of a reflection sound in the sound field, the acoustic feedback system being integrated with the electronic musical instrument to form a combination; and a plurality of loudspeakers coupled to the combination of the acoustic feedback system and the electronic musical instrument for acoustically reproducing the music signal and the reflection signal so as to concurrently introduce the music sound and the reflection sound into the sound field.

39. An apparatus for controlling a sound field, comprising:

an input device that sequentially provides performance information;

a generator that is coupled to the input device to constitute a music signal generating apparatus for generating a music signal representative of a music sound in response to the performance information;

a plurality of microphones arranged separately from each other, each microphone collecting sounds including the music sound introduced into the sound field by the music signal generating apparatus so as to produce a sound signal representative of the sounds;

a processor that is coupled to the microphones to constitute an acoustic feedback system for processing each sound signal produced by each microphone so as to generate a reflection signal representative of a reflection sound in the sound field, the acoustic feedback system being integrated with the music signal generating apparatus to form a combination; and a plurality of loudspeakers that are coupled to the combination of the acoustic feedback system and the music signal generating apparatus for acoustically reproducing the music signal and the reflection signal so as to concurrently introduce the music sound and the reflection sound into the sound field.

40. An apparatus according to claim 1, further including $n^2$ number of cancelers disposed between n number of the microphones and the loudspeakers for canceling direct feedback of sounds from the loudspeakers to the microphones.

41. An apparatus according to claim 1, further including adder means for adding another music signal to the sound signals produced by the microphones so as to enhance an ensemble of said another music signal and the music signal generated by the generator means.

* * * * *